(12) United States Patent
Otsuka et al.

(10) Patent No.: US 8,513,806 B2
(45) Date of Patent: Aug. 20, 2013

(54) LAMINATED HIGH MELTING POINT SOLDERING LAYER FORMED BY TLP BONDING AND FABRICATION METHOD FOR THE SAME, AND SEMICONDUCTOR DEVICE

(75) Inventors: Takukazu Otsuka, Kyoto (JP); Keiji Okumura, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 13/173,122

(22) Filed: Jun. 30, 2011

(65) Prior Publication Data

US 2013/0001782 A1    Jan. 3, 2013

(51) Int. Cl.
*H01L 23/532* (2006.01)
*H01L 23/485* (2006.01)
*B32B 15/01* (2006.01)
*B23K 1/20* (2006.01)
*B23K 35/02* (2006.01)

(52) U.S. Cl.
USPC ............ 257/751; 257/E23.154; 257/E23.019; 257/E23.026; 257/E23.06; 257/E29.002; 257/773; 257/779; 257/76

(58) Field of Classification Search
USPC ............. 257/76, 779, 751, E23.026, E23.06, 257/E29.002
See application file for complete search history.

(56) References Cited

U.S. PATENT DOCUMENTS

| 2005/0073039 A1* | 4/2005 | Kasuya et al. | 257/690 |
| 2006/0151871 A1 | 7/2006 | Mehrotra | |
| 2007/0205253 A1* | 9/2007 | Hubner | 228/193 |
| 2011/0020582 A1* | 1/2011 | Kojima et al. | 428/64.5 |
| 2012/0112201 A1* | 5/2012 | Otsuka et al. | 257/76 |

FOREIGN PATENT DOCUMENTS

| JP | 4-503480 A | 6/1992 |
| WO | 2006/074165 A2 | 7/2006 |

OTHER PUBLICATIONS

Brian Rowden et al., "High Temperature SiC Power Module Packaging", Proceedings of the ASME 2009 International Mechanical Engineering Congress & Exposition, IMECE2009, Nov. 13-19, Lake Buena Vista, Florida, USA, pp. 1-6.

Warren C. Welch et al., "Transfer of Metal MEMS Packages Using a Wafer-Level Solder Transfer Technique", IEEE Transactions on Advanced Packaging, vol. 28, No. 4, Nov. 2005, pp. 643-649.

* cited by examiner

*Primary Examiner* — A O Williams
(74) *Attorney, Agent, or Firm* — Cantor Colburn LLP

(57) ABSTRACT

The laminated high melting point soldering layer includes: a laminated structure which laminated a plurality of three-layered structures, the respective three-layered structures including a low melting point metal thin film layer and a high melting point metal thin film layers disposed on a surface and a back side surface of the low melting point metal thin film layer; a first high melting point metal layer disposed on the surface of the laminated structure; and a second high melting point metal layer disposed on the back side surface of the laminated structure. The low melting point metal thin film layer and the high melting point metal thin film layer are mutually alloyed by TLP, and the laminated structure, and the first high melting point metal layer and the second high melting point metal layer are mutually alloyed by the TLP bonding.

15 Claims, 12 Drawing Sheets

US 8,513,806 B2

LAMINATED HIGH MELTING POINT SOLDERING LAYER FORMED BY TLP BONDING AND FABRICATION METHOD FOR THE SAME, AND SEMICONDUCTOR DEVICE

TECHNICAL FIELD

The present invention relates to a laminated high melting point soldering layer, a fabrication method for such high melting point soldering layer, and a semiconductor device. More specifically, the present invention relates to a laminated high melting point soldering layer fabricated by TLP (Transient Liquid Phase) bonding, a fabrication method for such high melting point soldering layer, and a semiconductor device.

BACKGROUND ART

Currently, research and development of an SiC (Silicon Carbide) device are done in many research institutions. As a characteristic of the SiC devices, it can be mentioned of low on resistance, high speed switching, high temperature operation, etc.

Conventionally, since the temperature span which can operate in Si devices, such as IGBTs (Insulated Gate Bipolar Transistors), currently used in the field of a semiconductor power module is to about 150 degrees C., it was possible to have driven even when using low melting point solder, such as a conventional Sn—Ag alloy system.

However, since the SiC devices can theoretically operate to about 400 degrees C., if the SiC devices are driven at high temperature when using the conventional low melting point solder, the short circuit between electrodes, the delamination between the SiC devices and a base plate, etc. occurred by fusing bonding parts when using the low melting point solder, and then the reliability of the SiC devices are spoiled.

Accordingly, the SiC devices could not be driven at high temperature, and the characteristic of the SiC devices was not able to be used.

It is already disclosed about an interconnection method of the SiC device, and a low thermal resistance package (for example, refer to Patent Literature 1 and Patent Literature 2). In Patent Literature 1 and Patent Literature 2, a fabrication method of the package housing the SiC device is disclosed, and the SiC device is bonded for other parts or conductive surfaces using TLP bonding technology.

The TLP technology currently disclosed in the literatures is the technology for bonding the SiC device by fabricating high temperature melting point bonding using the mixed crystal of three kinds or four kinds of conductive metals fabricated simultaneously. Since the TLP bonding of three kinds or four kinds of metallic materials is used as a result, the components of the mixed crystal of the conductive metal are complicated.

On the other hand, it is already disclosed about a compound solder article whose melting point is comparatively low (for example, the melting point is not more than 430 degrees C.) including Sn and/or Pb (for example, refer to Patent Literature 3). In Patent Literature 3, the solder alloy has a smaller difference in temperature of the liquid phase and solid phase than that of the basic solder.

Furthermore, it is already disclosed also about transfer of metal MEMS packages using a wafer-level solder transfer technology (for example, refer to Non Patent Literature 1). In Non Patent Literature 1, a device wafer and a package cap are bonded by TLP technology using relatively thin Ni—Sn layer.

CITATION LIST

Patent Literature 1: PCT International Publication No. WO2006/074165
Patent Literature 2: U.S. Patent Application Publication No. 2006/0151871
Patent Literature 3: Published Japanese Translations of PCT International Publication for Patent Application No. H04-503480
Non Patent Literature 1: Warren C. Welch, III, Junseok Chae, and Khalil Najafi, "Transfer of Metal MEMS Packages Using a Wafer-Level Solder Transfer Technique", IEEE TRANSACTION ON ADVANCED PACKAGING, VOL, 28, No. 4, NOVEMBER 2005, pp. 643-649

SUMMARY OF THE INVENTION

Technical Problem

Currently, in order to satisfy a Pb-free request, generally, Sn—Ag solder etc. which are low melting point solder are used. However, as stated above, the low melting point solder cannot be used with the device in which a high temperature drive is possible such as SiC since the melting temperatures are low at the maximum about 230 degrees C.

The present inventors found out a method of obtaining a high melting point alloy by dissolving of low melting point solder and diffusing the dissolved low melting point solder into high melting point solder. That is, the present inventors found out a fabrication method for a high melting point soldering layer characterized by having a larger difference in temperature of a liquid phase and a solid phase with the solder alloy than that of the basic solder using TLP bonding of only two kinds of metallic materials. The high melting point soldering layer uses relatively thick solder, and has a melting temperature not less than a melting temperature of a low melting point metal layer.

Furthermore, the present inventors found out that the process temperature could be applied into low temperature and the process time duration could be shortened by laminating the high melting point soldering layer.

The object of the present invention is to provide a laminated high melting point soldering layer and a fabrication method for such laminated high melting point soldering layer which can apply the process temperature into low temperature and can shorten the process time duration.

Moreover, the object of the present invention is to provide a semiconductor device to which the laminated high melting point soldering layer is applied.

Solution to Problem

According to an aspect of the present invention, provided is a laminated high melting point soldering layer comprising: (a) a laminated structure which laminated a plurality of three-layered structures, the respective three-layered structures including a low melting point metal thin film layer and a high melting point metal thin film layers disposed on a surface and a back side surface of the low melting point metal thin film layer; (b) a first high melting point metal layer disposed on a surface of the laminated structure; and (c) a second high melting point metal layer disposed on a back side surface of the laminated structure, wherein (d) the low melting point metal thin film layer and the respective high melting point metal thin film layers are mutually alloyed by transient liquid phase bonding, and the laminated structure and the first high melting point metal layer and the second high melting point metal layer are mutually alloyed by the transient liquid phase bonding.

According to another aspect of the present invention, provided is a semiconductor device comprising: (a) an insulating substrate; a first conducting metal layer disposed on the insulating substrate; (b) a first laminated high melting point soldering layer disposed on the first conducting metal layer; and (c) a semiconductor device disposed on the first laminated high melting point soldering layer, wherein (d) the first laminated high melting point soldering layer is formed by transient liquid phase bonding.

According to another aspect of the present invention, provided is a semiconductor device comprising: (a) an insulating substrate; (b) a second conducting metal layer disposed on the insulating substrate; (b) a second laminated high melting point soldering layer disposed on the second conducting metal layer; and (c) a base plate disposed on the second laminated high melting point soldering layer, wherein (d) the second laminated high melting point soldering layer is formed by transient liquid phase bonding.

According to another aspect of the present invention, provided is a fabrication method for a laminated high melting point soldering layer comprising: (a) performing planarization of: a laminated structure which laminated a plurality of three-layered structures, the respective three-layered structures including a low melting point metal thin film layer and a high melting point metal thin film layers disposed on a surface and a back side surface of the low melting point metal thin film layer; a first high melting point metal layer disposed on a surface of the laminated structure; and a second high melting point metal layer disposed on a back side surface of the laminated structure; (b) annealing not less than a melting temperature of the low melting point metal thin film layer, diffusing the laminated structure into the first high melting point metal layer and the second high melting point metal layer, and then forming transient liquid phase bonding; and (c) cooling the transient liquid phase bonding, wherein (d) a melting temperature of the high melting point soldering layer is not less than the melting temperature of the low melting point metal layer.

Advantageous Effects of Invention

According to the present invention, it can provide a laminated high melting point soldering layer and a fabrication method for such laminated high melting point soldering layer which can increase mass production volume efficiency by applying the process temperature into low temperature and shortening the process time duration.

Moreover, according to the present invention, it can provide the semiconductor device to which the laminated high melting point soldering layer is applied.

DESCRIPTION OF EMBODIMENTS

Figure 1A:
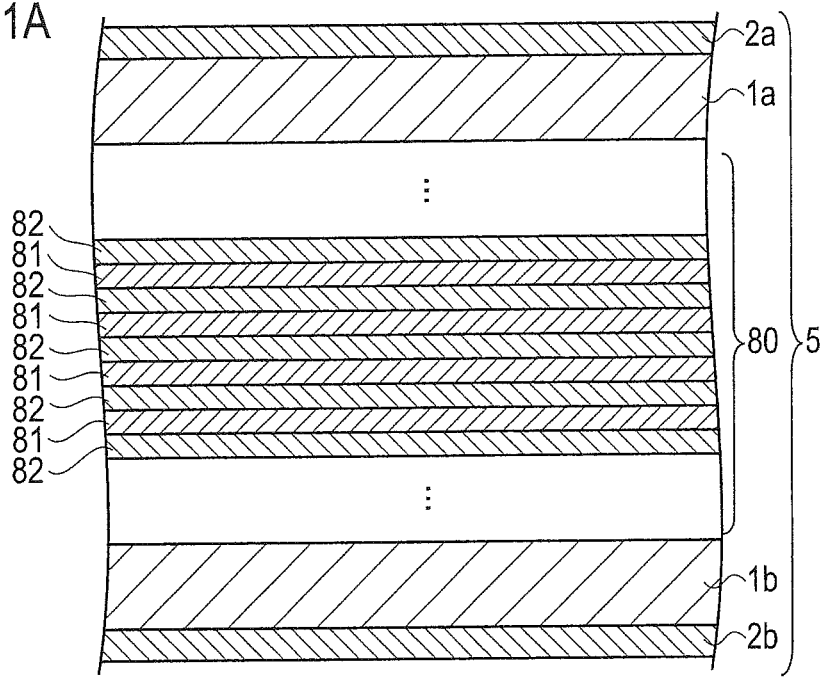
FIG. 1A is a schematic cross-sectional configuration diagram showing a laminated high melting point soldering layer according to an embodiment.

Next, embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

EMBODIMENT

Configuration of Laminated High Melting Point Soldering Layer

Figure 1B:
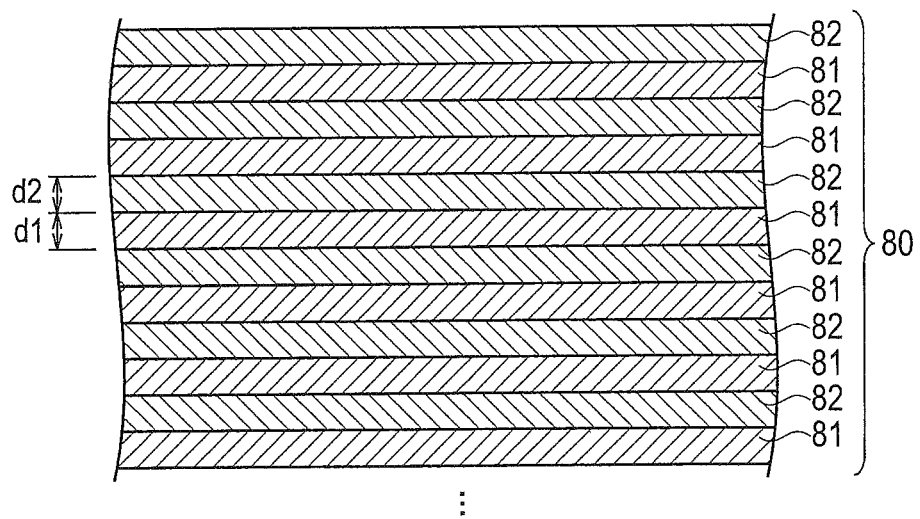
FIG. 1B is a schematic cross-sectional configuration diagram of a laminated structure which laminated a plurality of three-layered structures including a low melting point metal thin film layer and high melting point metal thin film layers disposed on the surface and back side surface of the low melting point metal thin film layer.

FIG. 1A is a schematic cross-sectional configuration diagram showing a laminated high melting point soldering layer 5 according to an embodiment, and FIG. 1B is a schematic cross-sectional configuration diagram of a laminated structure 80 which laminated a plurality of three-layered structures, the respective three-layered structures including a low melting point metal thin film layer 81, and high melting point metal thin film layers 82 disposed on the surface and back side surface of the low melting point metal thin film layer 81.

As shown in FIG. 1A and FIG. 1B, the laminated high melting point soldering layer 5 according to the embodiment includes: the laminated structure 80 which laminated the plurality of the three-layered structures, the respective three-layered structures including the low melting point metal thin film layer 81, and the high melting point metal thin film layers 82 disposed on the surface and the back side surface of the low melting point metal thin film layer 81; a first high melting point metal layer 1a disposed on the surface of the laminated structure 80; and a second high melting point metal layer 1b disposed on the back side surface of the laminated structure 80. In the laminated structure 80, the low melting point metal thin film layer 81, and the high melting point metal thin film layers 82 disposed on the surface and the back side surface of the low melting point metal thin film layer 81 are mutually alloyed by the transient liquid phase bonding. The laminated structure 80, and the first high melting point metal layer 1a and the second high melting point metal layer 1b are mutually alloyed by the transient liquid phase bonding.

In this case, for example, it is preferable that the ratio $d_1:d_2$ is about 1:1, where $d_1$ is the thickness of the low melting point metal thin film layer 81, and $d_2$ is the thickness of the high melting point metal thin film layer 82 which compose the laminated structure 80. Moreover, the thickness of the whole laminated structure 80 is about 25 μm, for example.

In this case, the reason that the ratio $d_1:d_2$ is about 1:1 is to be close to the density setting of a portion currently drawn by a hatching region of the binary phase transition diagram of FIG. 10 described later (where $d_1$ is the thickness of the low melting point metal thin film layer 81, and $d_2$ is the thickness of the high melting point metal thin film layer 82). That is, in FIG. 10, it is because the binary phase transition can rise to a portion of 724 degrees C. from 480 degrees of the melting point which is a target, along the interface between the (solid phase+liquid phase) state and the solid phase state, as becoming Ag-rich. It is difficult to form the high melting point alloy if the thickness $d_1$ of the low melting point metal thin film layer 81 is set up thickly and the ratio $d_1:d_2$ is simply set to 2:1 (where $d_1$ is the thickness of the low melting point metal thin film layer 81 and $d_2$ is the thickness of the high melting point metal thin film layer 82). On the contrary, if the ratio $d_1:d_2$ is set to 1:2, it is possible to form the high melting point alloy.

The low melting point metal thin film layer 81 is formed with Sn, for example, and the respective high melting point metal thin film layers 82 is formed with Ag, for example. Since the Ag layer and the Sn layer can be thin-layered by using the vacuum deposition or the sputtering technology, the thickness of the whole laminated structure 80 can be thin-layered. Thus, the laminated structure 80 is laminated with thin films such as Ag/Sn/Ag/Sn/Ag . . . as continuous layers. Thus, the diffusion length at the time of forming with the transient liquid phase bonding can be shortened by thin-layering each of the layers included in the laminated structure 80.

As a result, the value of the melting point between the melting point of the low melting point metal thin film layer 81 and the melting point of the high melting point metal thin film layers 82 is obtained for the value of the melting point of the laminated high melting point soldering layer 5 according to the embodiment. Alternatively, the value of the melting point between the melting point of the low melting point metal thin film layer 81, and the melting point of the first high melting point metal layer 1a and/or the second high melting point metal layer 1b is obtained for the value of the melting point of the laminated high melting point soldering layer 5 according to the embodiment.

The low melting point metal thin film layer 81 may be formed with an Sn—Ag eutectic solder layer except the Sn layer. Also, the first high melting point metal layer 1a and the second high melting point metal layer 1b are formed with an Ag layer.

Alternatively, the first high melting point metal layer 1a may be formed with an Ag layer, and the second high melting point metal layer 1b may be formed with an Ni layer.

Figure 10:
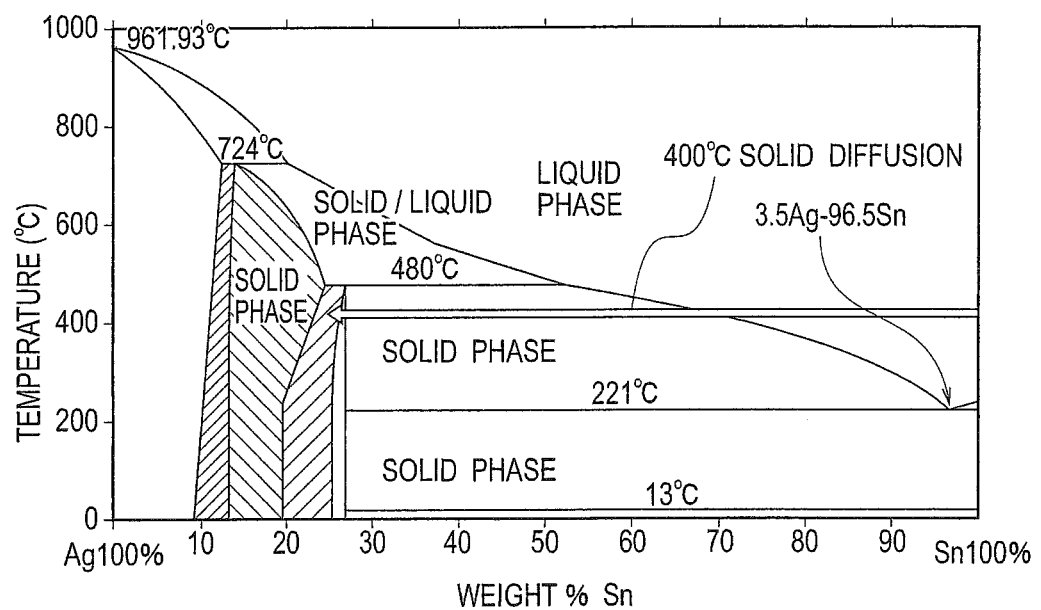
FIG. 10 is a theoretical explanatory diagram showing the phase change of the laminated high melting point soldering layer according to the embodiment, and is a binary phase transition diagram showing Ag—Sn solder.

As shown in FIG. 10 described later, the Sn—Ag eutectic solder layer is composed of composition of 96.5 minus or plus 1% of Sn, and 3.5 minus or plus 1% of Ag.

The temperature for forming with the transient liquid phase bonding is not less than 250 degrees C. and not more than 480 degrees C., and is not less than 250 degrees C. and not more than 350 degrees C. preferable.

Also, the laminated high melting point soldering layer 5 may further include a low melting point adhesive layers for covering the first high melting point metal layer 1a and the second high melting point metal layer 1b, respectively. For example, as shown in FIG. 1A, the laminated high melting point soldering layer 5 may include a first low melting point adhesive layer 2a disposed on the surface of the first high melting point metal layer 1a, which is the opposite side of the back side where the laminated structure 80 is disposed, and a second low melting point adhesive layer 2b disposed on the back side of the second high melting point metal layer 1b, which is the opposite side of the surface where the laminated structure 80 is disposed. Each of the first low melting point adhesive layer 2a and the second low melting point adhesive layer 2b is a layer for the improvement in wettability. The first low melting point adhesive layer 2a and the second low melting point adhesive layer 2b are formed with an Sn layer, for example.

(Semiconductor Device)

Figure 2:
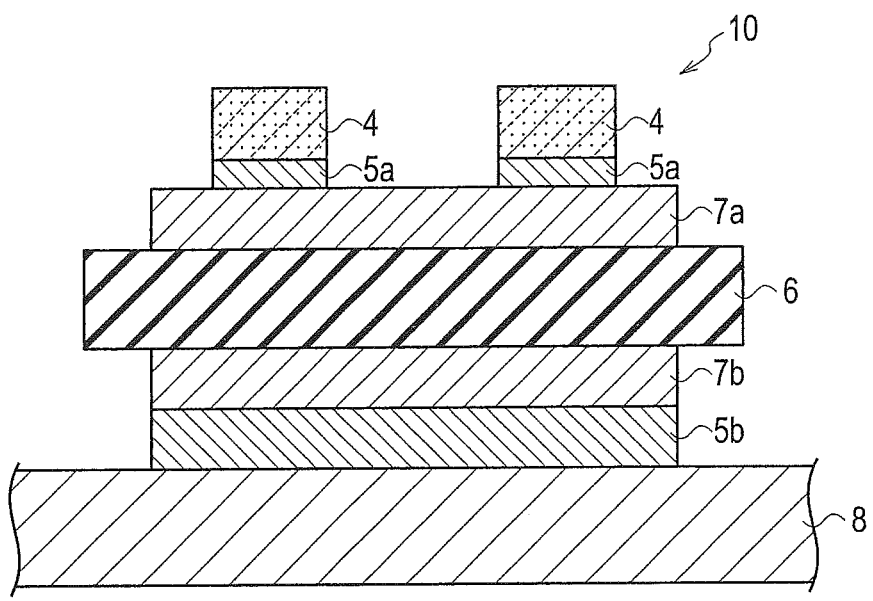
FIG. 2 is a schematic cross-sectional configuration diagram of a semiconductor device to which the laminated high melting point soldering layer according to the embodiment is applied.

As shown in FIG. 2, a schematic cross-sectional structure of the semiconductor device 10 to which the laminated high melting point soldering layer according to the embodiment is applied includes: an insulating substrate 6; a first conducting metal layer 7a disposed on the insulating substrate 6; a first laminated high melting point soldering layer 5a disposed on the first conducting metal layer 7a; and a semiconductor device 4 disposed on the first laminated high melting point soldering layer 5a.

The schematic cross-sectional structure of the semiconductor device 10 to which the laminated high melting point soldering layer according to the embodiment is applied may further include: a second conducting metal layer 7b disposed on the back side surface of the insulating substrate 6, which is the opposite side of the surface of the insulating substrate 6 where the first conducting metal layer 7a is disposed; a second laminated high melting point soldering layer 5b disposed on the back side surface of the second conducting metal layer 7b, which is the opposite side of the surface of the second conducting metal layer 7b where the insulating substrate 6 is disposed; and a base plate 8 disposed on the back side surface of the second laminated high melting point soldering layer 5b, which is the opposite side of the surface of the second laminated high melting point soldering layer 5b where the second conducting metal layer 7b is disposed.

As shown in FIG. 1A and FIG. 1B, each of the first laminated high melting point soldering layer 5a and the second laminated high melting point soldering layer 5b includes: the laminated structure 80 which laminated the plurality of the three-layered structures, the respective three-layered structures including the low melting point metal thin film layer 81 and the high melting point metal thin film layers 82 disposed on the surface and the back side surface of the low melting point metal thin film layer 81; the first high melting point metal layer 1a disposed on the surface of the laminated structure 80; and the second high melting point metal layer 1b disposed on the back side surface of the laminated structure 80, respectively. In the laminated structure 80, the low melting point metal thin film layer 81, and the high melting point metal thin film layers 82 disposed on the surface and the back side surface of the low melting point metal thin film layer 81 are mutually alloyed by the transient liquid phase bonding. Also, the laminated structure 80, and the first high melting point metal layer 1a and the second high melting point metal layer 1b are mutually alloyed by the transient liquid phase bonding.

The semiconductor device 10 to which the laminated high melting point soldering layer according to the embodiment is applied may simply include: the insulating substrate 6; the second conducting metal layer 7b disposed on the insulating substrate 6; the second laminated high melting point soldering layer 5b disposed on the second conducting metal layer 7b; and the base plate 8 disposed on the second laminated high melting point soldering layer 5b. In this case, the second laminated high melting point soldering layer 5b is formed by the transient liquid phase bonding.

The first laminated high melting point soldering layer 5a formed by the transient liquid phase bonding technology is used in order to bond the first conducting metal layer 7a and the semiconductor device 4. The second laminated high melting point soldering layer 5b formed by the transient liquid phase bonding technology is used in order to bond the second conducting metal layer 7b and the base plate 8.

A formation sequence of the laminated high melting point soldering layers by the transient liquid phase technology includes following two steps. As a first step, the second conducting metal layer 7b and the base plate 8 are bonded via the second high melting point soldering layer 5b. Next, as a second step, the first conducting metal layer 7a and the semiconductor device 4 are bonded via the first laminated high melting point soldering layer 5a. Since the thermal capacity of the base plate 8 is larger than the thermal capacity of the semiconductor device 4, as the first step, the bonding required for considerable time is previously performed by bonding the second conducting metal layer 7b and the base plate 8, and then, as the second step, the first conducting metal layer 7a and the semiconductor device 4 are bonded for a short time. Accordingly, the semiconductor device 4 can be protected thermally.

It is effective to select the material near the coefficient of thermal expansion of the insulating substrate 6, for example, materials composed of compositions of copper and molybdenum (CuMo), copper and tungsten (CuW), aluminum silicon carbide (AlSiC), or other metal matrix composites with adaptive thermal expansion ranges, as a material of the base plate 8. This is because the curvature accompanying the difference of the coefficient of thermal expansion between the insulating substrate 6 and the base plate 8 can be suppressed and the reliability of the semiconductor device 4 can be improved by selecting the material near the coefficient of thermal expansion of the insulating substrate 6 as a material of the base plate 8.

On the surface of the base plate 8 bonded to the second laminated high melting point soldering layer 5b, nickel plating etc. having the thickness of about 2 μm to 15 μm may be performed, for example, in order to improve the wettability between the base plate 8 and the second laminated high melting point soldering layer 5b.

The insulating substrate 6 sandwiched between the first conducting metal layer 7a and the second conducting metal layer 7b can be formed with alumina ($Al_2O_3$), aluminum nitride (AlN) or silicon nitride ($Si_3N_4$), etc., for example.

Figure 3:
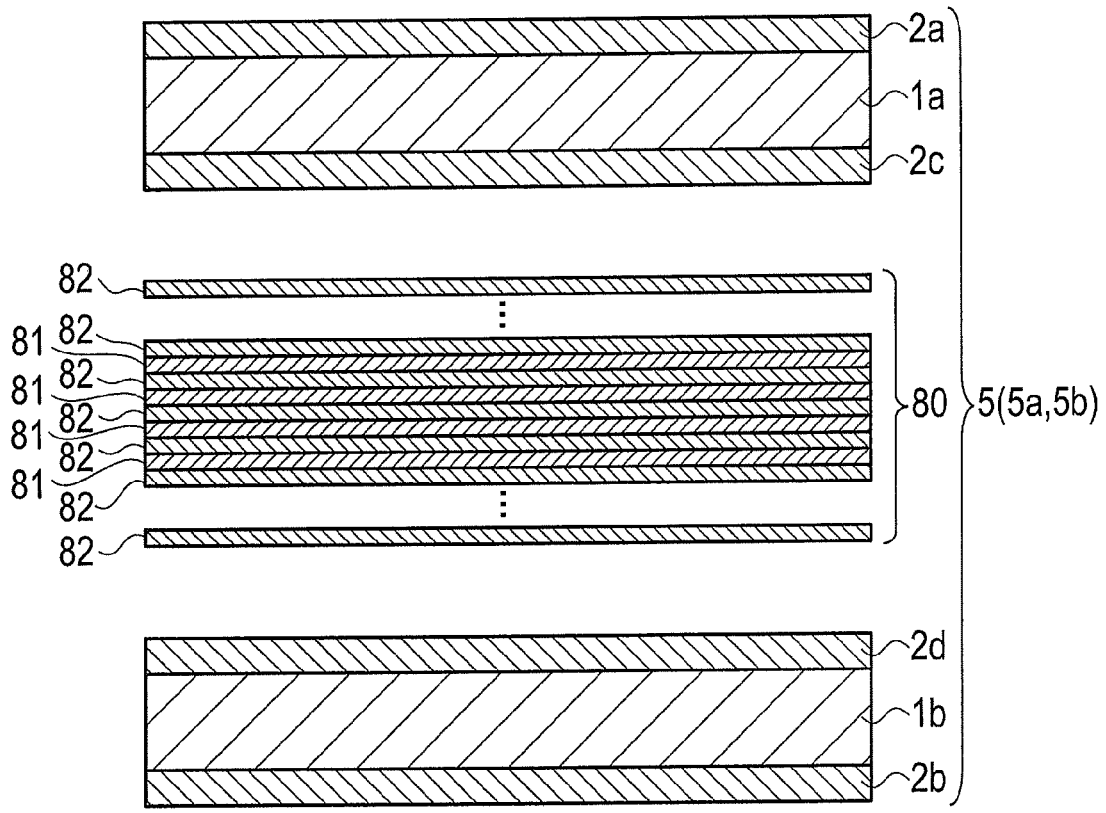
FIG. 3 is a schematic cross-sectional configuration diagram for explaining a layered structure of the laminated high melting point soldering layer according to the embodiment.

As shown in FIG. 3, the first laminated high melting point soldering layer 5a and the second laminated high melting point soldering layer 5b may include: a third low melting point adhesive layer 2c disposed on the back side of the first high melting point metal layer 1a opposite to the first low melting point adhesive layer 2a disposed on the surface of the first high melting point metal layer 1a; and a fourth low melting point adhesive layer 2d disposed on the surface of the first high melting point metal layer 1a opposite to the second low melting point adhesive layer 2b disposed on the back side of the second high melting point metal layer 1b.

The third low melting point adhesive layer 2c and the fourth low melting point adhesive layer 2d are formed with an Sn layer, for example, as well as the first low melting point adhesive layer 2a and the second low melting point adhesive layer 2b.

As a result, the laminated structure 80, the first laminated high melting point metal layer 1a, and the second laminated high melting point metal layer 1b are mutually alloyed by the transient liquid phase bonding as well as the example shown in FIG. 1A and FIG. 1B.

The first low melting point adhesive layer 2a, the second low melting point adhesive layer 2b, the third low melting point adhesive layer 2c, and the fourth low melting point adhesive layer 2d are formed with a plating Sn layer whose thickness is about 0.5 μm to about 1.5 μm, for example.

Figure 4:
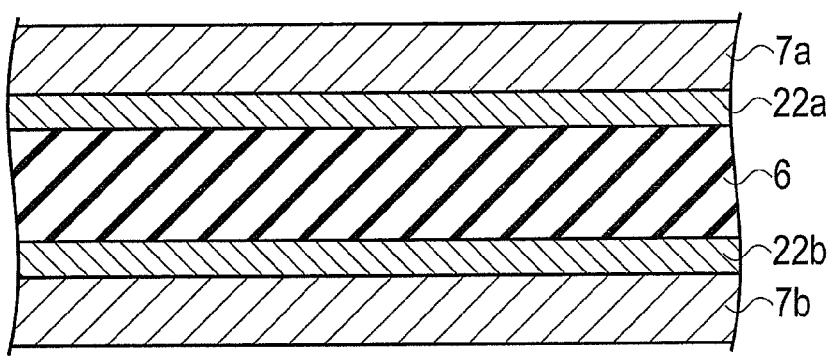
FIG. 4 is a detailed schematic cross-sectional configuration diagram of an insulating substrate of FIG. 2.

As shown in FIG. 4, the first barrier metal layer 22a, the second barrier metal layer 22b, etc. may be also formed on the insulating substrate 6 in order to improve wettability with the first conducting metal layer 7a and the second conducting metal layer 7b and to barrier the solder. The first barrier metal layer 22a and the second barrier metal layer 22b are effective to form with an Ni plated layer or a Ti layer, for example.

Each of the first conducting metal layer 7a and the second conducting metal layer 7b can be formed with aluminum (Al), copper (Cu), or other conductive metals which can flow through the suitable amount of current value. The first conducting metal layer 7a and the second conducting metal layer 7b have the thickness of about 0.1 mm to about 0.5 mm, for example.

(Fabrication Method for Laminated High Melting Point Soldering Layer)

A schematic cross-section structure for explaining one process of a fabrication method for the laminated high melting point soldering layer according to the embodiment is expressed as shown in FIG. 5 to FIG. 9. Also, a binary phase transition diagram of the Ag—Sn based solder applied to the laminated high melting point soldering layer according to the embodiment is expressed as shown in FIG. 10.

As shown in FIG. 5 to FIG. 9, the fabrication method for the laminated high melting point soldering layer according to the embodiment includes: performing the planarization of the laminated structure 80 which laminated the plurality of the three-layered structures, the respective three-layered structures including the low melting point metal thin film layer 81 and the high melting point metal thin film layers 82 disposed on the surface and the back side surface of the low melting point metal thin film layer 81, the first high melting point metal layer 12a disposed on the surface of the laminated structure 80, and the second high melting point metal layer 12b disposed on the back side surface of the laminated structure 80; forming a transient liquid phase bonding by annealing not less than the melting temperature of the low melting point metal thin film layer 81, and diffusing the low melting point metal thin film layer 81 into the high melting point metal thin film layers 82, and diffusing the laminated structure 80 into the alloy of the first high melting point metal layer 12a and the second high melting point metal layer 12b; and cooling the transient liquid phase bonding. As a result, it can obtain the laminated high melting point soldering layer 5 having a melting temperature not less than the melting temperature of the low melting point metal thin film layer 81.

The low melting point metal thin film layer 81 is formed with an Sn layer or an Sn—Ag eutectic solder layer, and the high melting point metal thin film layers 82, the first high melting point metal layer 12a and the second high melting point metal layer 12b are formed with an Ag layer.

Alternatively, it may be effective that: the low melting point metal thin film layer 81 is formed with an Sn layer or an Sn—Ag eutectic solder layer; the high melting point metal thin film layers 82 and the first high melting point metal layer 12a are formed with an Ag layer; and the second high melting point metal layer 12b is formed with an Ni layer.

The Sn—Ag eutectic solder layer is composed of composition of 96.5 minus or plus 1% of Sn, and 3.5 minus or plus 1% of Ag.

The temperature for forming the transient liquid phase bonding is not less than 250 degrees C. and not more than 480 degrees C., and is not less than 250 degrees C. and not more than 350 degrees C. preferable. In this case, the reasons why the low temperature process is used at not less than about 250 degrees C. and not more than about 350 degrees C. are as follows. For example, as shown in FIG. 2, the heat is applied to the materials having various coefficients of thermal expansion when performing an assembly process of module. Therefore, it is because the warping of module, etc. will become difficult to occur when the assembly process of module is performed at the low temperature as much as possible. Moreover, the reason set to about 350 degrees C. as the maximum is because it is no problem also in the case of forming the module, since the value of about 350 degrees C. is used when bonding using high temperature lead solder (its melting point is 300 degrees C. to 315 degrees C.).

Hereinafter, the fabrication method for the laminated high melting point soldering layer according to the embodiment will be explained in detail.

Figure 5:
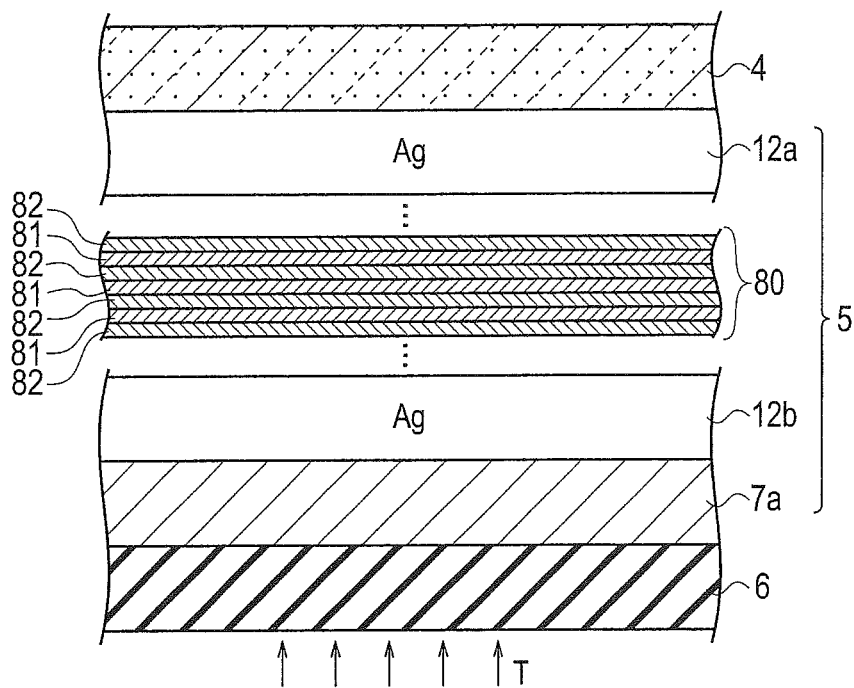
FIG. 5 is a schematic cross-sectional configuration diagram for explaining one process of a fabrication method for the laminated high melting point soldering layer according to the embodiment (Phase 1).

(a) first of all, as shown in FIG. 5, the laminated high melting point soldering layer 5 having layer shape is disposed between the first conducting metal layer 7a on the insulating substrate 6 and the semiconductor device 4, and is annealed at the heating temperature T of about 250 degrees C., and thereby the low melting point metal thin film layer 81 of the laminated structure 80 is dissolve. In addition, the laminated high melting point soldering layer 5 having the layer shape includes: the laminated structure 80 which laminated the plurality of three-layered structures, the respective three-layered structures including the low melting point metal thin film layer 81 composed of Sn layer and the high melting point metal thin film layers 82 composed of Ag disposed on the surface and the back side surface of the low melting point metal thin film layer 81; the first high melting point metal layer 12a disposed on the surface of the laminated structure 80 and composed of Ag layer; and the second high melting point metal layer 12b composed of Ag layer and disposed on the back side surface of the laminated structure 80.

Figure 6:
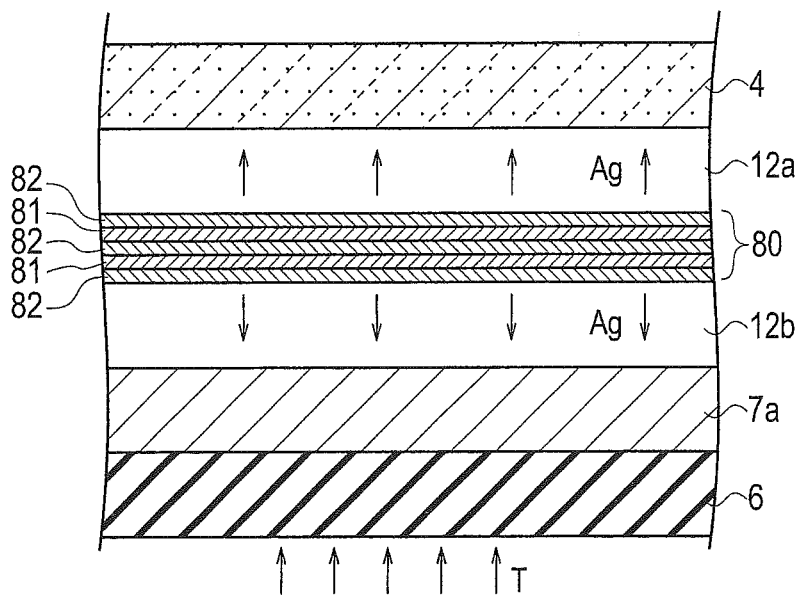
FIG. 6 is a schematic cross-sectional configuration diagram for explaining one process of the fabrication method for the laminated high melting point soldering layer according to the embodiment (Phase 2).

(b) Next, when the annealing temperature T is raised to about 350 degrees C., as shown in FIG. 6, the transient liquid phase of Sn is started toward the high melting point metal thin film layer 82 and the first high melting point metal layer 12a from the low melting point metal thin film layer 81 of the laminated structure 80. Simultaneously, the transient liquid phase of Sn is started toward the high melting point metal thin film layer 82 and the second high melting point metal layer 12b from the low melting point metal thin film layer 81 of the laminated structure 80.

Figure 7:
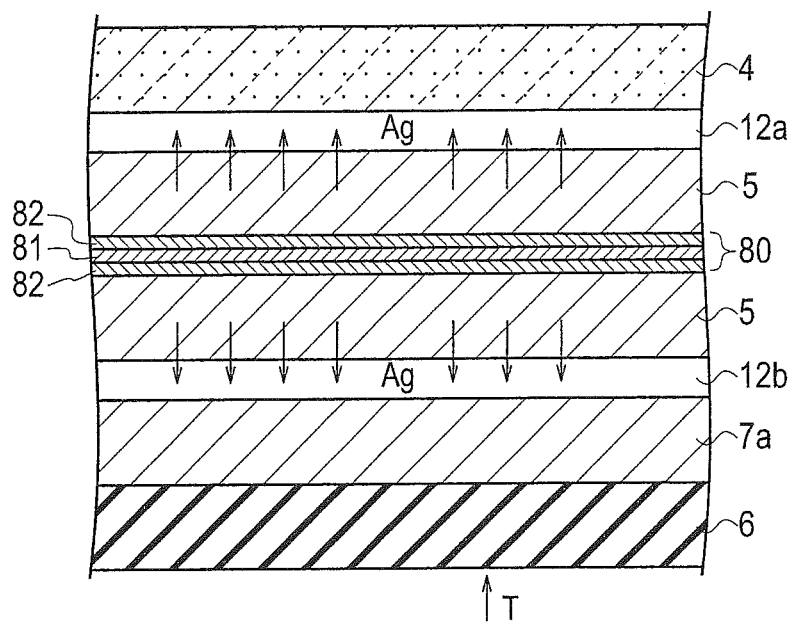
FIG. 7 is a schematic cross-sectional configuration diagram for explaining one process of the fabrication method for the laminated high melting point soldering layer according to the embodiment (Phase 3).

(c) Next, when the annealing temperature T shall be about 350 degrees C. and the annealing time is continued, as shown in FIG. 7, the laminated high melting point soldering layer 5 composed of an Ag—Sn alloy is formed between the laminated structure 80 and the first high melting point metal layer 12a by the transient liquid phase of Sn toward the high melting point metal thin film layer 82 and the first high melting point metal layer 12a from the low melting point metal thin film layer 81 of the laminated structure 80. Similarly, the laminated high melting point soldering layer 5 composed of an Ag—Sn alloy is also formed between the laminated structure 80 and the second high melting point metal layer 12b by the transient liquid phase of Sn toward the high melting point metal thin film layer 82 and the second high melting point metal layer 12b from the low melting point metal thin film layer 81 of the laminated structure 80. As shown in FIG. 7, each of the laminated structure 80, the first high melting point metal layer 12a, and the second high melting point metal layer 12b is thin-layerized by the transient liquid phase of Sn.

Figure 8:
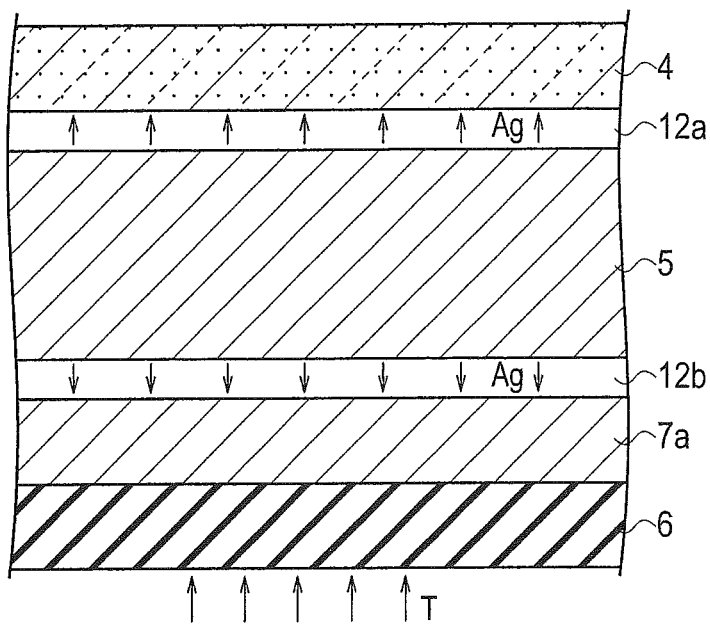
FIG. 8 is a schematic cross-sectional configuration diagram for explaining one process of the fabrication method for the laminated high melting point soldering layer according to the embodiment (Phase 4).

(d) If the annealing temperature T shall be about 350 degrees C. and the annealing time is further continued, as shown in FIG. 8, the laminated structure 80 is disappeared, the laminated high melting point soldering layer 5 composed of an Ag—Sn alloy is formed thickly, and each of the first high melting point metal layer 12a and the second high melting point metal layer 12b is further thin-layerized.

Figure 9:
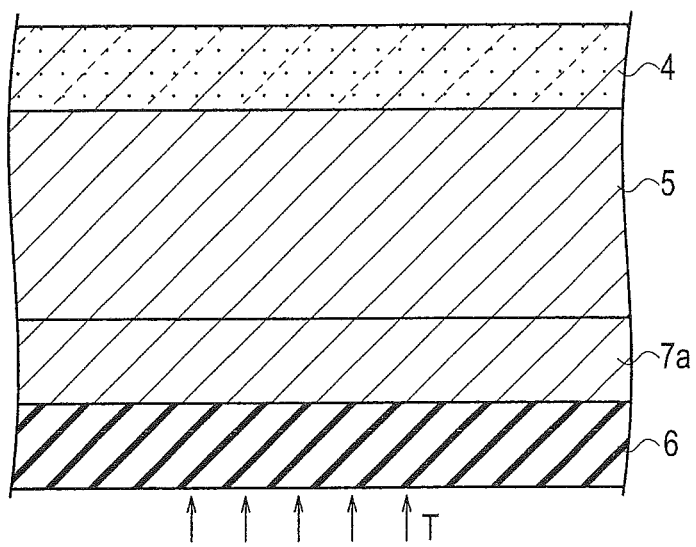
FIG. 9 is a schematic cross-sectional configuration diagram for explaining one process of the fabrication method for the laminated high melting point soldering layer according to the embodiment (Phase 5).

(e) If the annealing temperature T shall be about 350 degrees C. and the annealing time is further continued, as shown in FIG. 9, each of the first high melting point metal layer 12a and the second high melting point metal layer 12b is disappeared, and The laminated high melting point soldering layer 5 composed of an Ag—Sn alloy is formed between the first conducting metal layer 7a on the insulating substrate 6, and the semiconductor device 4.

The reason why the value of the annealing temperature T shall be not more than 350 degrees C. is because the high melting point alloy of 480 degrees C. can be obtained by dissolving Sn which is the low melting point solder in not more than 350 degrees C., and performing the solid phase diffusion into the Ag layer which is the high melting point solder, as shown in the binary phase transition diagram of the Ag—Sn based solder of FIG. 10.

As shown in FIG. 10, the Ag—Sn based solder is dissolved at not more than 350 degrees C. in not less than 80% of the concentration of Sn, and thereby it can obtain the high melting point solid phase of 480 degrees C.

(Substrate Attachment Process)

Figure 11:
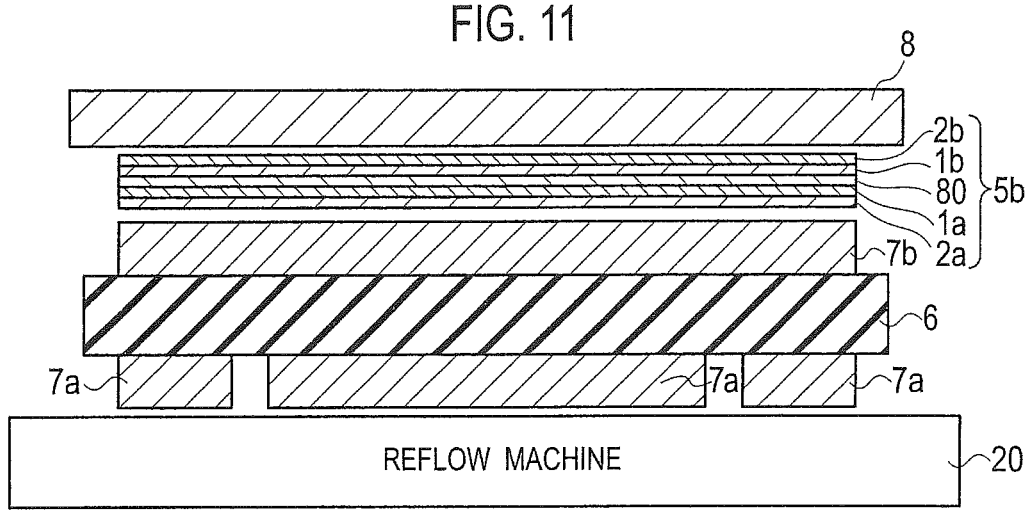
FIG. 11 is a schematic cross-sectional configuration diagram for explaining a substrate attaching process as one process of the fabrication method for the semiconductor device to which the laminated high melting point soldering layer according to the embodiment is applied.
Figure 12:
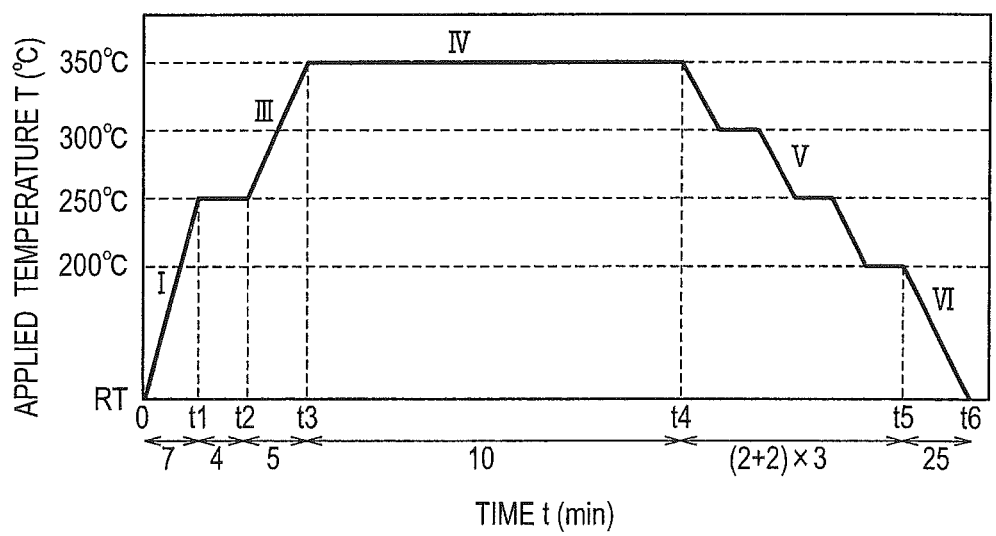
FIG. 12 is a diagram showing the relation between the temperature and the time period for explaining the detailed process of the substrate attaching process shown in FIG. 11.

As one process of the fabrication method for the semiconductor device 10 to which the laminated high melting point soldering layer according to the embodiment is applied, a schematic cross-section structure for explaining a substrate attachment process is expressed as shown in FIG. 11. Moreover, the relation between the annealing temperature T and the time t for explaining the details of the substrate attachment process of FIG. 11 is expressed as shown in FIG. 12.

In FIG. 11, the laminated structure 80 has the thickness of about 25 μm. The first high melting point metal layer 1a and the second high melting point metal layer 1b are formed with an Ag layer having the thickness of about 0.2 μm to about 1 μm, for example. The first low melting point adhesive layer 2a and the second low melting point adhesive layer 2b are formed with a plating Sn layer having the thickness of about 1.5 μm, for example.

The laminated high melting point soldering layer 5 having the structure shown in FIG. 1 and FIG. 3 is pressed mechanically with a press machine in order to perform a planarization. As the mechanical pressure at this time, if a weight (about 500 g) is used, for example, the pressure pressurized on the device is about $2.5 \times 10^3$ Pa. Furthermore, when applying the pressure having a value, which is two to three orders of magnitude higher, such as about 2 MPa, for example, the increase in diffusion velocity and shortening of process time duration can be achieved by filling the gaps between the device and the Ag layer, and between the substrate and the Ag layer. That is, the objects of pressurization are to fill the gaps by applying the pressure during the process, to collapse the oxide film by the pressure, and also to increase the diffusion velocity.

A method for shortening the process time duration in not more than 1 hour is to shorten the diffusion velocity with the assist by the above-mentioned pressure, or to shorten the diffusion velocity by laminating the plurality of the three-layered structures, the respective three-layered structures being a layered unit composed of the high melting point metal thin film layer 82 (Ag)/the low melting point metal thin film layer 81 (Sn)/the high melting point metal thin film layer 82 (Ag). In the laminated structure which laminated the plurality of the three-layered structures (the respective three-layered structure is the layered unit) composed of the high melting point metal thin film layer 82 (Ag)/the low melting point metal thin film layer 81 (Sn)/the high melting point metal thin film layer 82 (Ag), Sn is laminated as the low melting point metal thin film layer 81. Therefore, the quantity of Sn as the whole laminated structure 80 is the same as that of the layered structure which laminated only one three-layered structure (the layered unit) composed of the high melting point metal thin film layer 82 (Ag)/the low melting point metal thin film layer 81 (Sn)/the high melting point metal thin film layer 82 (Ag) (i.e., only one set of the layered structure composed of Ag—Sn—Ag in contrast with the plurality of the sets of the layered structures composed of Ag—Sn—Ag). However, the dissolved quantity of Sn in each laminated layer is reduced in the laminated structure which laminated the plurality of the three-layered structures (the respective three-layered structure is the layered unit) composed of the high melting point metal thin film layer 82 (Ag)/the low melting point metal thin film layer 81 (Sn)/the high melting point metal thin film layer 82 (Ag). Therefore, the time period for diffusing the dissolved Sn completely to Ag is reduced. In the layered structure which laminated only one three-layered structure (the layered unit) composed of the high melting point metal thin film layer 82 (Ag)/the low melting point metal thin film layer 81 (Sn)/the high melting point metal thin film layer 82 (Ag), since all Sn(s) needed in order that Sn dissolves and is diffused to Ag is in one layer, there many much quantity of Sn, and the equivalent time is need to diffuse Sn to the Ag layer completely. In this case, since the ratio d1:d2 of the thickness d1 of the low melting point metal thin film layer 81 (Sn) and the thickness d2 of the high melting point metal thin film layer 82 (Ag) is set to 1:1, Sn of the low melting point metal thin film layer 81 melts earlier than Ag, Ag of the high melting point metal thin film layer 82 melts into the melted Sn, and thereby the Ag—Sn alloy is formed in each layered unit. The Ag—Sn alloy is formed also as the whole laminated structure 80. Furthermore, the process time duration can be further shortened by applying the pressure during the process and speeding up the diffusion velocity of Sn.

It is possible to also reduce the process temperature (its value is about 350 degrees C.) by laminating the plurality of the three-layered structures, the respective three-layered structures composed of the high melting point metal thin film layer 82 (Ag)/the low melting point metal thin film layer 81 (Sn)/the high melting point metal thin film layer 82 (Ag).

As shown in FIG. 11, the substrate attachment process of the fabrication method for the semiconductor device 10 to which the laminated high melting point soldering layer according to the embodiment is applied performs the process condition shown in FIG. 12 in the configuration disposing the insulating substrate 6 formed with the first conducting metal layer 7a and the second conducting metal layer 7b on the reflow machine 20, and disposing the base plate 8 via the second laminated high melting point soldering layer 5b on the second conducting metal layer 7b.

(I) First of all, the annealing temperature T is raised from the room temperature RT to about 250 degrees C. for 7 minutes of time 0 to time t1. The annealing temperature T is set up not less than the melting temperature for forming the liquid phase of the metal (Sn) of the low melting point metal thin film layer 81, in order to begin to melt the metal (Sn) of the low melting point metal thin film layer 81 into the TLP alloy. It is preferable to apply a certain amount of pressure in order to activate the liquid phase at low temperature. In the configuration of FIG. 11, loading weight in particular for pressurization is not performed since the weight of the base plate 8 is heavy.

(II) Next, the annealing temperature T is kept up at about 250 degrees C. for 4 minutes of time t1 to time t2.

(III) Next, the annealing temperature T is raised from about 250 degrees C. to about 350 degrees C. for 5 minutes of time t2 to time t3. The annealing temperature T is raised until the binary based Ag—Sn based alloy of a target is obtained, in order to assist to diffuse the metal of the low melting point metal thin film layer 81 into the structure of the TLP alloy.

(IV) Next, the annealing temperature T is kept up at about 350 degrees C. for 10 minutes of time t3 to time t4. In this case, the period of the time t3 to the time t4 may be not less than 10 minutes and not more than 30 minutes.

(V) Next, for 12 minutes of the time t4 to the time t5, firstly, the annealing temperature T is reduced to about 300 degrees C. by 25 degrees C. per minute for 2 minutes and then is maintained for 2 minutes, and thereafter such operation is repeated until the annealing temperature T reaches to about 200 degrees C. while being reduced by 50 degrees C. In this case, the size of the second laminated high melting point soldering layer 5b is large, and its thermal capacity is also large. Accordingly, the stress reduction of the second high melting point soldering layer 5b having great size can be performed according to such a controlled cooling process.

(VI) Next, in the period of time t5 to the time t6, self-cooling is performed from about 200 degrees C. to the room temperature RT.

As a result, the laminated high melting point soldering layer 5b can be obtained. Hereinafter, it will supplement with the following explanations about the alloying process. First of all, if one set of the layered structure composed of Ag—Sn—Ag is explained as an example in order to simplify explanation, the alloy whose melting point is 480 degrees C. shown in FIG. 10 can be obtained by applying the density of Ag and the density of Sn into 2:1. Even when using Ag—Sn solder, the ratio of the density of the sum total becomes Ag-rich to some extent. Therefore, since it shifts to left-hand side toward FIG. 10 so as clearly also from the binary phase transition diagram, the alloy having the melting point which is 480 degrees C. can be obtained. That is, Sn of the low melting point metal thin film layer 81 is dissolved and then is diffused to Ag of the high melting point metal thin film layers 82, and thereby the high melting point alloy whose density of Sn is 75% and the density of Ag is 25% can be obtained. Therefore, the density of Ag will not be 75% because the solder of Ag—Sn melts, but it is necessary to set up the relation between the density of Ag and the density of Sn into 2:1 from the beginning when forming the layered structure which laminated the plurality of the layered units composed of Ag—Sn—Ag. Sn of the low melting point metal thin film layer 81 is dissolved and then is diffused to Ag of the high melting point metal thin film layers 82, and thereby the high melting point alloy whose density of Sn is 75% and the density of Ag is 25% can be obtained. As a result, the laminated high melting point soldering layer 5a can be obtained.

(Semiconductor Device Attachment Process)

A schematic cross-section structure for explaining a semiconductor device attachment process is expressed as shown in FIG. 11 as one process of the fabrication method for the semiconductor device 10 to which the laminated high melting point soldering layer according to the embodiment is applied. Also, the relation between the annealing temperature T and the time t for explaining the details of the semiconductor device attachment process of FIG. 13 is expressed as shown in FIG. 14.

Figure 13:
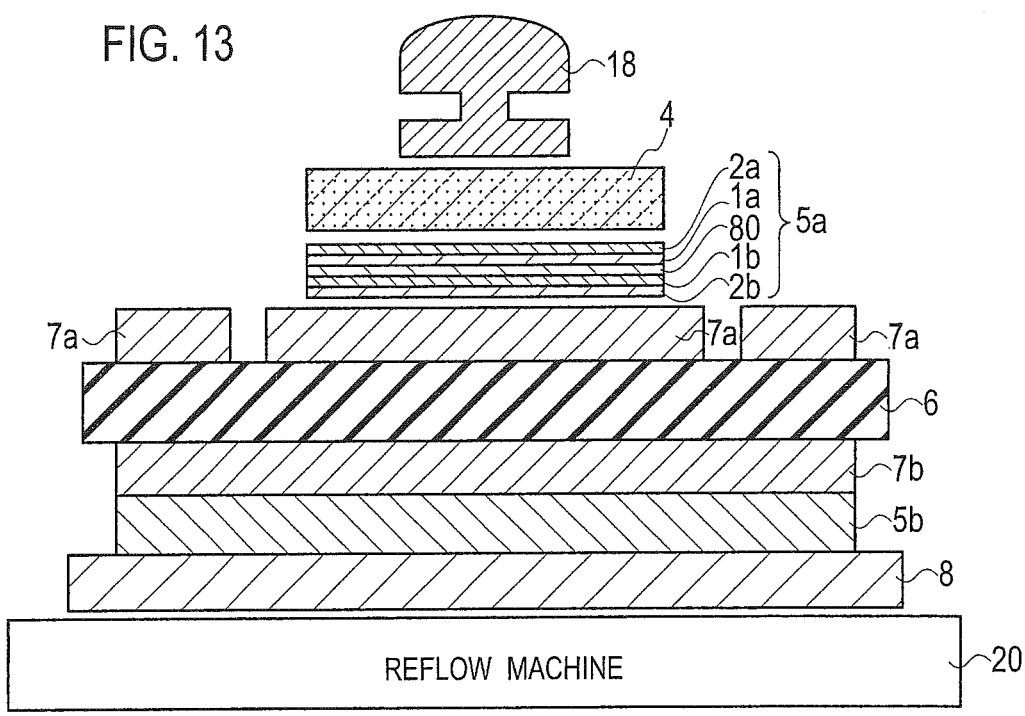
FIG. 13 is a schematic cross-sectional configuration diagram for explaining a semiconductor device attaching process as one process of the fabrication method for the semiconductor device to which the laminated high melting point soldering layer according to the embodiment is applied.

In FIG. 13, the laminated structure 80 has the thickness of about 25 µm. The first high melting point metal layer 1a and the second high melting point metal layer 1b are formed with an Ag layer having the thickness of about 0.2 µm to about 1 µm, for example. The first low melting point adhesive layer 2a and the second low melting point adhesive layer 2b are formed with a plating Sn layer having the thickness of about 0.5 µm, for example.

In the attachment process of the semiconductor device 4, the point of preventing the drain electrode of the semiconductor device 4 from reacting completely is important during the reactions of the TLP bonding formation. Accordingly, the Sn plated layer is made thin by forming the Sn plated layer having a thickness of about 0.5 µm compared with the Sn plated layer having a thickness of about 1.5 µm used at the time of the substrate attachment process.

Figure 14:
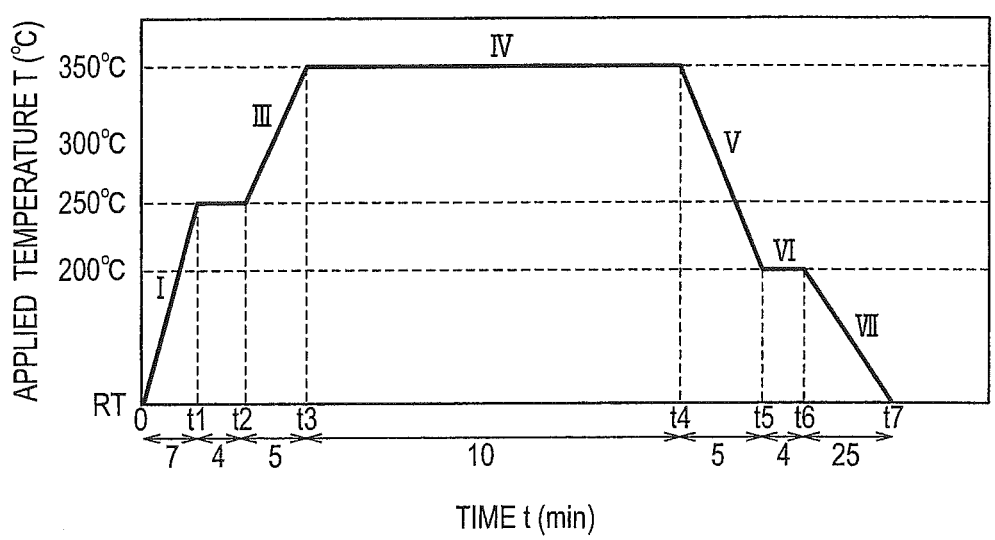
FIG. 14 is a diagram showing the relation between the temperature and time period for explaining the detailed process of the semiconductor device attachment process shown in FIG. 13.

The semiconductor device attachment process of the fabrication method for the semiconductor device 10 to which the laminated high melting point soldering layer according to the embodiment is applied performs the process condition shown in FIG. 14, after the substrate attachment process, in the configuration disposing the layered structure composed of the base plate 8, the second laminated high melting point soldering layer 5b, the second conducting metal layer 7b, the insulating substrate 6, and the first conducting metal layer 7a and disposing the semiconductor device 4 via the first laminated high melting point soldering layer 5a on the first conducting metal layer 7a on the reflow machine 20 as shown in FIG. 13. In the configuration of FIG. 13, loading weight is performed by disposing a weight 18 for pressurization in particular on the semiconductor device 4.

(I) First of all, the annealing temperature T is raised from the room temperature RT to about 250 degrees C. for 7 minutes of time 0 to time t1. The annealing temperature T is set up not less than the melting temperature for forming the liquid phase of the metal (Sn) of the low melting point metal thin film layer 81, in order to begin to melt the metal (Sn) of the low melting point metal thin film layer 81 into the TLP alloy. It is preferable to apply a certain amount of pressure in order to activate the liquid phase at low temperature.

(II) Next, the annealing temperature T is kept up at about 250 degrees C. for 4 minutes of time t1 to time t2.

(III) Next, the annealing temperature T is raised from about 250 degrees C. to about 350 degrees C. for 5 minutes of time t2 to time t3. The annealing temperature T is raised until the binary based Ag—Sn based alloy of a target is obtained, in order to assist to diffuse the metal of the low melting point metal thin film layer 81 into the structure of the TLP alloy.

(IV) Next, the annealing temperature T is kept up at about 350 degrees C. for 10 minutes of time t3 to time t4. In this case, the period of the time t3 to the time t4 may be not less than 10 minutes and not more than 30 minutes.

(V) Next, the annealing temperature T is reduced to about 200 degrees C. by 30 degrees C. per minute for 5 minutes of time t4 to time t5. In this case, the size of the first laminated high melting point soldering layer 5a is large, and its thermal capacity is also large. Accordingly, the stress reduction of the second laminated high melting point soldering layer 5b having great size can be performed according to such a controlled cooling process.

(VI) Next, the annealing temperature T is kept up at about 200 degrees C. in the period of time t5 to time t6.

(VII) Next, self-cooling is performed from about 200 degrees C. to the room temperature RT in the period of time t6 to time t7.

As a result, the laminated high melting point soldering layer 5a can be obtained. That is, the relation between the density of Ag and the density of Sn into 2:1 is set up from the beginning when forming the layered structure which laminated the plurality of the layered units composed of Ag—Sn—Ag, Sn of the low melting point metal thin film layer 81 is dissolved and then is diffused to Ag of the high melting point metal thin film layers 82, and thereby the high melting point alloy whose density of Sn is 75% and the density of Ag is 25% can be obtained. As a result, the laminated high melting point soldering layer 5a can be obtained.

In the semiconductor device 10 to which the laminated high melting point soldering layer according to the embodiment is applied, it is important that the point of preventing the drain electrode of the semiconductor device 4 from reacting to the Sn layer completely in the TLP bonding formation reaction at the time of the attachment process of the semiconductor device 4 secures electric and mechanical reliability.

In the semiconductor device 10 to which the laminated high melting point soldering layer according to the embodiment is applied, stable operation is verified even when operating at above 300 degrees C.

(Die Detachment Strength)

Figure 15:
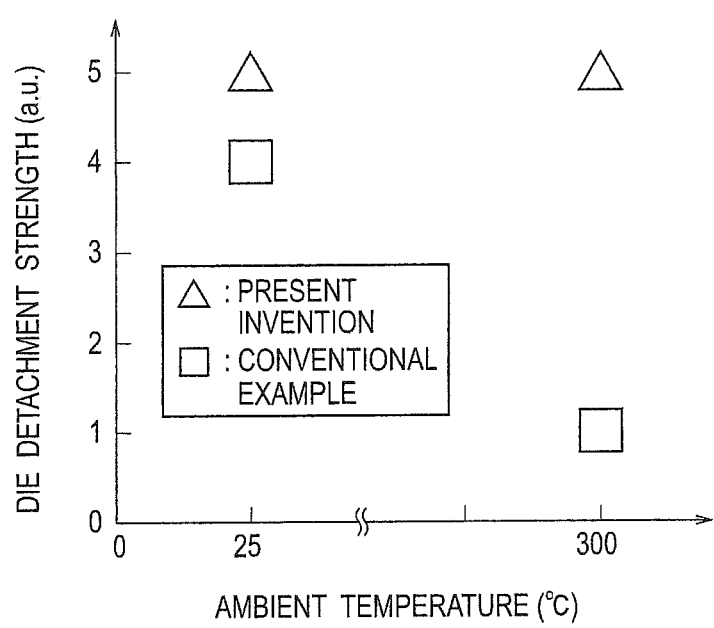
FIG. 15 is a diagram showing the ambient temperature change in the die detachment strength, in the conventional semiconductor device (using the Pb—Sn based low melting point soldering layer) and the semiconductor device according to the present embodiment (using the Ag—Sn based high melting point soldering layer).

FIG. 15 shows the ambient temperature change in the die detachment strength, in the conventional semiconductor device (using the Pb—Sn based low melting point soldering layer) and the semiconductor device according to the present embodiment (using the Ag—Sn based high melting point soldering layer).

Although the die detachment strength is reduced remarkably at the high temperature according to the conventional semiconductor device, substantial reduction is not observed according to the semiconductor device according to the present embodiment.

(Configuration of Power Module)

Figure 16:
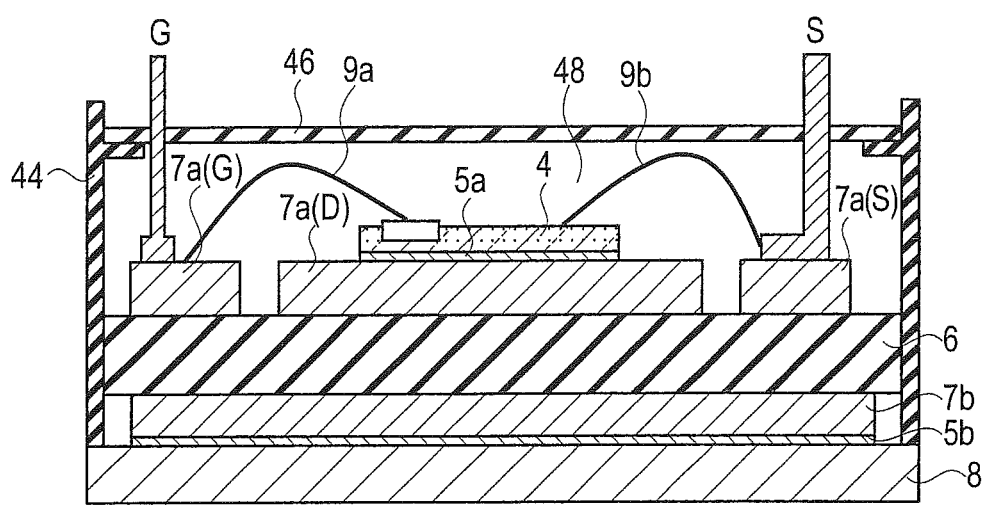
FIG. 16 is a diagram showing a module configuration example of the semiconductor device to which the laminated high melting point soldering layer according to the embodiment is applied.

As shown in FIG. 16, a module configuration example of the semiconductor device 10 formed by applying the laminated high melting point soldering layer according to the embodiment includes: the base plate 8; the insulating substrate 6 disposed on the base plate 8 via the second laminated high melting point soldering layer 5b and the second conducting metal layer 7b; and the semiconductor device 4 disposed on the insulating substrate 6 via the first conducting metal layer 7a and the first laminated high melting point soldering layer 5a.

The first conducting metal layer 7a disposed on the insulating substrate 6 is divided into three parts as shown in FIG. 16. The first conducting metal layer 7a(G) is connected to a gate electrode of the semiconductor device 4 via a bonding wire 9a, and is connected to a gate lead G. The first conducting metal layer 7a(D) is connected to a drain electrode of the semiconductor device 4 via the first laminated high melting point soldering layer 5a, and is connected to a drain lead D (not shown). The first conducting metal layer 7a(S) is connected to a source electrode of the semiconductor device 4 via a bonding wire 9b, and is connected to a source lead S.

The semiconductor device 10 is surrounded with a frame 44, and hollow closure is performed by a sealing plate 46. Nitrogen gas, gaseous argon, etc. are enclosed with a hollow part 48.

The semiconductor module having predetermined capability can be formed by the configuration which disposes the semiconductor device 10 in parallel (disposes 16 pieces of semiconductor devices 10 in parallel, for example) and extracts the respective source electrodes, the respective drain electrodes, and the respective gate electrodes in common to the semiconductor devices 10 disposed in parallel.

Modified Example

Figures 17A, 17B:
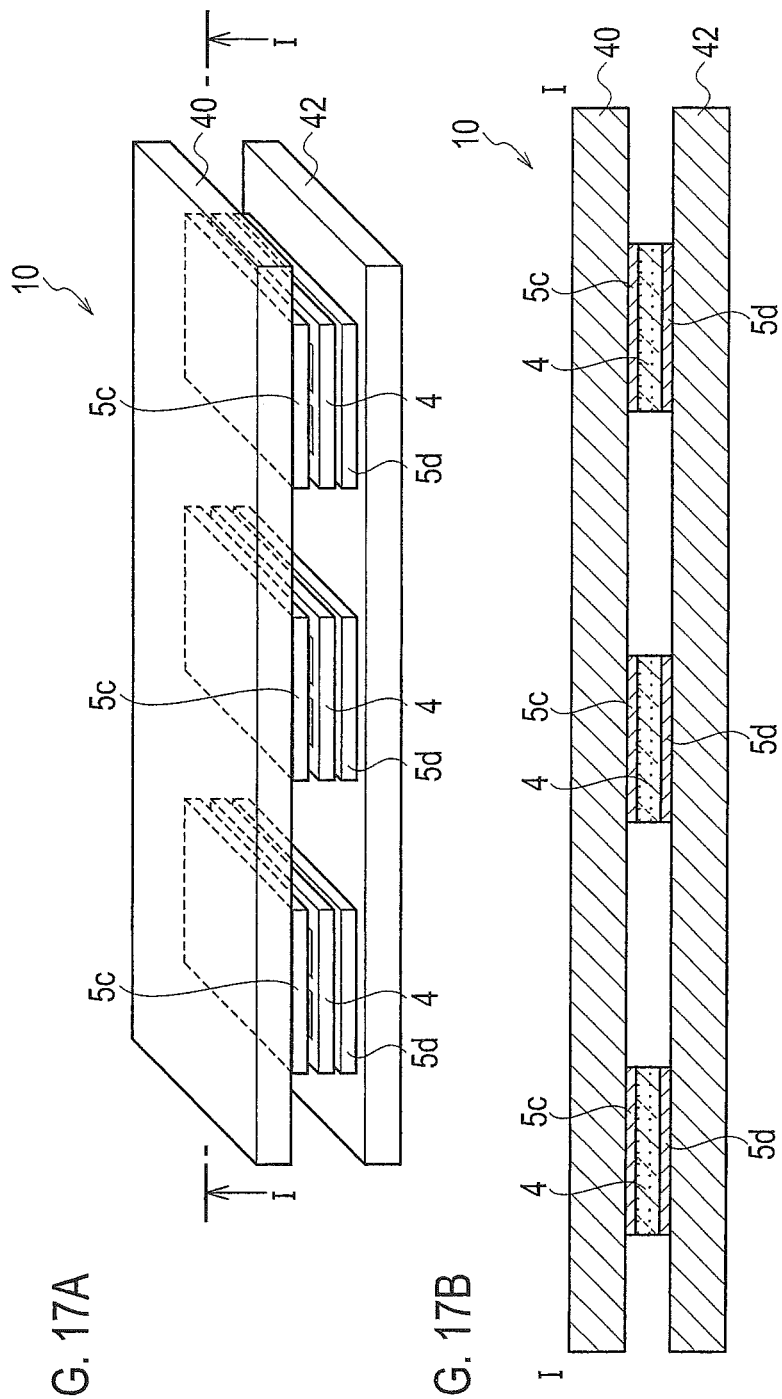
FIG. 17A is a schematic bird's-eye view showing a semiconductor device according to a modified example to which the laminated high melting point soldering layer related to the embodiment is applied.
FIG. 17B is a schematic cross-sectional configuration diagram taken in the line I-I of FIG. 17A.

As shown in FIGS. 17A and 17B, a semiconductor device 10 according to a modified example to which the laminated high melting point soldering layer according to the embodiment is applied includes: a semiconductor device 4; a third laminated high melting point soldering layer 5c disposed on the semiconductor device 4; a source side pad electrode 40 disposed on the third laminated high melting point soldering layer 5c; a fourth laminated high melting point soldering layer 5d disposed on the back side surface of the semiconductor device 4 of the opposite side to the surface where the third laminated high melting point soldering layer 5c is disposed; and a drain side pad electrode 42 disposed on the backside surface of the fourth laminated high melting point soldering layer 5d of the opposite side to the surface of the fourth laminated high melting point soldering layer 5d where the semiconductor device 4 is disposed. In the semiconductor device 10 shown in FIG. 17, the three semiconductor devices 4 are connected in parallel.

The third laminated high melting point soldering layer 5c bonds the source electrode and the source side pad electrode 40 of the semiconductor device 4 by the TLP bonding, and the fourth laminated high melting point soldering layer 5d bonds the drain electrode and the drain side pad electrode 42 of the semiconductor device 4 by the TLP bonding.

Since the configuration and the fabrication method for the third laminated high melting point soldering layer 5c and the fourth laminated high melting point soldering layer 5d are the same as the configuration and the fabrication method for the first laminated high melting point soldering layer 5a or the second laminated high melting point soldering layer 5b according to the embodiment, the duplicating explanation is omitted.

According to the semiconductor device 10 according to the modified example to which the laminated high melting point soldering layer according to the embodiment is applied, it can be made large capacity by applying the laminated high melting point soldering layer having the heat resistance of 480 degrees C. into the semiconductor devices 4 directly and connecting the semiconductor devices 4 in parallel, and it is excellent in the heat radiation characteristics by configuring the double side cooling structure. Accordingly, the semiconductor power module with high efficiency electrically and thermally can be fabricated by applying the laminated high melting point soldering layer according to the embodiment to the semiconductor power module.

Figure 18:
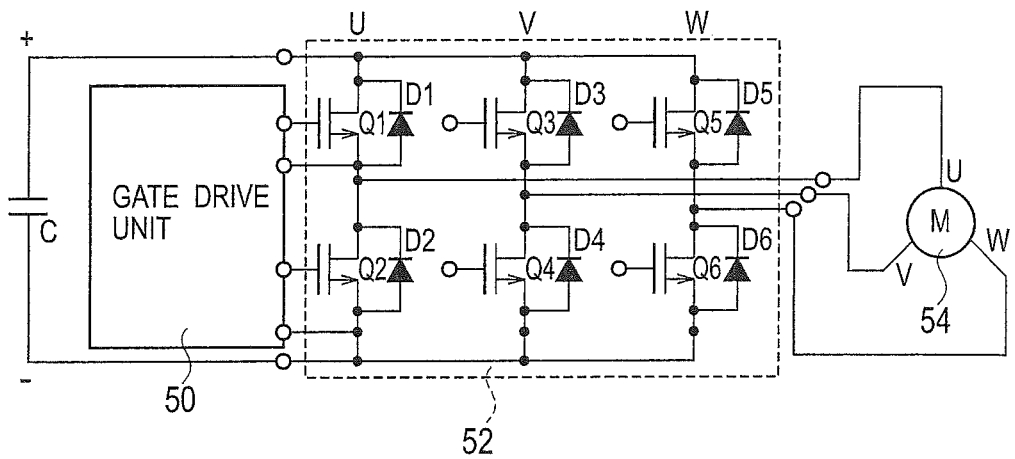
FIG. 18 is a schematic circuit configuration diagram showing a three phase inverter circuit composed by using the semiconductor device to which the laminated high melting point soldering layer according to the embodiment is applied.

As shown in FIG. 18, a schematic circuit configuration of a three phase inverter circuit composed using the semiconductor device 10 to which the laminated high melting point soldering layer according to the embodiment is applied includes: a gate drive unit 50; a power module unit 52 connected to the gate drive unit 50; and a three-phase motor unit 54. Inverters of U phase, V phase, and W phase are connected to the power module unit 52 corresponding to U phase, V phase, and W phase of the three-phase motor unit 54.

As for the power module unit 52, SiC-MOSFETs Q1 and Q2, Q3 and Q4, and Q5 and Q6 of an inverter configuration are connected between a positive terminal (+) and a negative terminal (−) to which the capacitor C is connected. Furthermore, diodes D1 to D6 are connected inversely in parallel between the source and the drain of SiC-MOSFETs Q1 to Q6, respectively.

The laminated high melting point soldering layer 5 according to the embodiment is formed in the drain electrode of SiC-MOSFETs Q1 to Q6 by the TLP bonding.

In addition, when applying the double side cooling structure shown in FIG. 17, the laminated high melting point soldering layer 5 is formed in the source electrode and drain electrode of the SiC-MOSFETs Q1 to Q6 by the TLP bonding.

Figure 19:
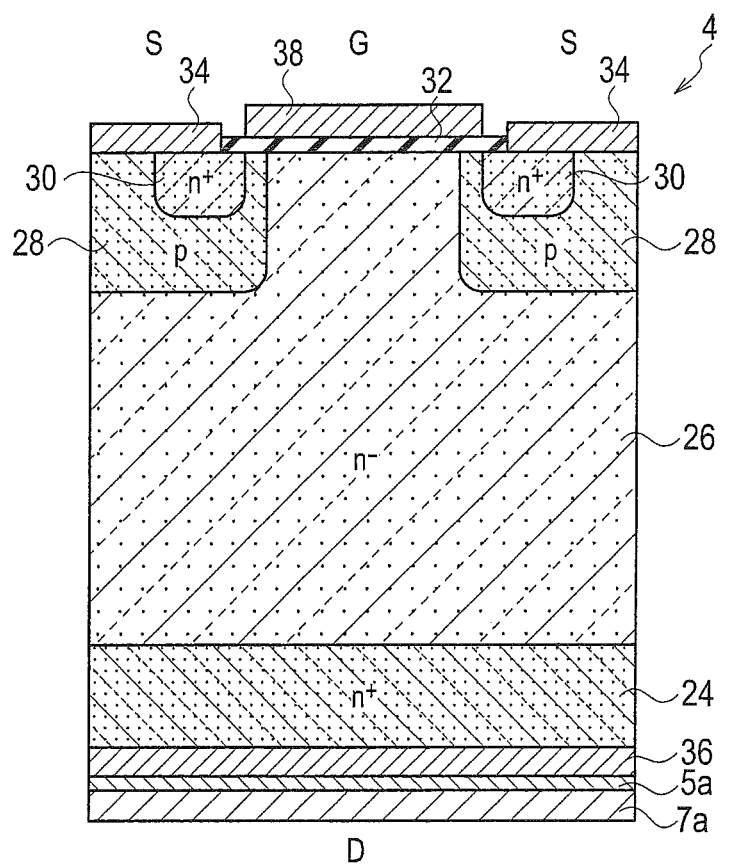
FIG. 19 shows an example of a semiconductor device for applying to the semiconductor device to which the laminated high melting point soldering layer according to the embodiment is applied, and is a schematic cross-sectional configuration diagram of SiC-MOSFET.

As shown in FIG. 19, as an example of the semiconductor device 4 applied to the semiconductor device 10 according to the embodiment, a schematic cross-sectional structure of the SiC-MOSFET includes: an n⁻ high-resistivity substrate 26; p base regions 28 formed in the surface side of then high-resistivity substrate 26; source regions 30 formed in the surface of the p base regions 28; a gate insulating film 32 disposed on the surface of the n⁻ high-resistivity substrate 26 between the p base regions 28; a gate electrode 38 disposed on the gate insulating film 32; source electrodes 34 connected to the source regions 30; an n⁺ drain region 24 disposed on the back side of the opposite side to the surface of the n⁻ high-resistivity substrate 26; and a drain electrode 36 connected to the n+ drain region 24.

As shown in FIG. 19, the drain electrode 36 is connected to the first conducting metal layer 7a via the first laminated high melting point soldering layer 5a. The first laminated high melting point soldering layer 5a is connected to the drain electrode 36 by the TLP bonding.

In addition, as the semiconductor device to which the first laminated high melting point soldering layer 5a is applied, GaN based FET etc. are also applicable instead of the SiC-MOSFET.

Furthermore, as the semiconductor device to which the first laminated high melting point soldering layer 5a is applied, a semiconductor whose bandgap energy is 1.1 eV to 8 eV can be used.

According to the laminated high melting point soldering layer according to the embodiment, since there is heat resistance to 480 degrees C., the power devices, such as SiC based FET and GaN based FET, can be driven at high temperature by applying the laminated high melting point soldering layer to the power device using SiC, GaN, etc.

According to the laminated high melting point soldering layer according to the embodiment, the electrical conductivity and the thermal conductivity can be made higher than the low melting point soldering layer. Accordingly, the semiconductor power module with high efficiency electrically and thermally can be fabricated by applying the laminated high melting point soldering layer according to the embodiment to the semiconductor power module.

According to the laminated high melting point soldering layer according to the embodiment, power loss can be suppressed because the electrical conductivity becomes high, and power conversion efficiency can be increased.

Also, the heat dissipation can become easy because the thermal conductivity becomes high, the improved performance, such as the weight saving of a heat sink, the control of the thermal run away of the semiconductor device, high frequency characteristics and power consumption efficiency, can be achieved, and the power conversion efficiency can be increased as a result.

According to the laminated high melting point soldering layer according to the embodiment, and the fabrication method for such laminated high melting point soldering layer, since the TLP bonding of the high melting point can be formed according to the low temperature processing, the damage to the semiconductor device and its component can be decreased at the time of formation of the laminated high melting point soldering layer.

According to the embodiment, it can provide a laminated high melting point soldering layer and a fabrication method for such laminated high melting point soldering layer which can increase mass production volume efficiency by applying the process temperature into low temperature and shortening the process time duration.

Also, according to the embodiment, it can provide the semiconductor device to which the laminated high melting point soldering layer is applied.

Other Embodiments

While the present invention is described in accordance with the aforementioned embodiment and its modified example, it should be understood that the description and drawings that configure part of this disclosure are not intended to limit the present invention. This disclosure makes clear a variety of alternative embodiments, working examples, and operational techniques for those skilled in the art.

Such being the case, the present invention covers a variety of embodiments, whether described or not.

INDUSTRIAL APPLICABILITY

The semiconductor device to which the laminated high melting point soldering layer of the present invention is applied is available in whole power devices, such as a power semiconductor module and an intelligent power module for hybrid vehicles, extreme environment electronics, defense and space electronics: volumetrically constrained, high power density, ride-through capabilities, and low cooling system allowances, distributed energy: areas of high power density and low cooling system allowances.

What is claimed is:

1. A laminated high melting point soldering layer comprising:
   a laminated structure which laminated a plurality of three-layered structures, the respective three-layered structures including a low melting point metal thin film layer and high melting point metal thin film layers disposed on a surface and a back side surface of the low melting point metal thin film layer;
   a first high melting point metal layer disposed on a surface of the laminated structure; and
   a second high melting point metal layer disposed on a back side surface of the laminated structure, wherein
   the low melting point metal thin film layer and the respective high melting point metal thin film layers are mutually alloyed by transient liquid phase bonding, and the laminated structure and the first high melting point metal layer and the second high melting point metal layer are mutually alloyed by the transient liquid phase bonding, wherein
   the low melting point metal thin film layer is formed with one of the group consisting of an Sn layer and an Sn—Ag eutectic solder layer, and
   the high melting point metal thin film layers and the first high melting point metal layer are formed with an Ag layer, and the second high melting point metal layer is formed with an Ni layer.

2. The laminated high melting point soldering layer according to claim 1, wherein the Sn—Ag eutectic solder layer is composed of composition of 96.5 minus or plus 1% of Sn and 3.5 minus or plus 1% of Ag.

3. The laminated high melting point soldering layer according to claim 1, wherein the temperature for forming the transient liquid phase bonding is not less than 250 degrees C. and not more than 350 degrees C.

4. The laminated high melting point soldering layer according to claim 1 further comprising a low melting point adhesive layer for covering both of the first high melting point metal layer and the second high melting point metal layer.

5. The laminated high melting point soldering layer according to claim 4, wherein the low melting point adhesive layer is formed with an Sn layer.

6. A semiconductor device comprising:
an insulating substrate;
a first conducting metal layer disposed on the insulating substrate;
a first laminated high melting point soldering layer disposed on the first conducting metal layer; and
a semiconductor device disposed on the first laminated high melting point soldering layer, wherein
the first laminated high melting point soldering layer is formed by transient liquid phase bonding, wherein
the first laminated high melting point soldering layer includes: a laminated structure which laminated a plurality of three-layered structures, the respective three-layered structures including a low melting point metal thin film layer and high melting point metal thin film layers disposed on a surface and a back side surface of the low melting point metal thin film layer; a first high melting point metal layer disposed on a surface of the laminated structure; and a second high melting point metal layer disposed on a back side surface of the laminated structure,
the low melting point metal thin film layer and the respective high melting point metal thin film layers are mutually alloyed by the transient liquid phase bonding, and
the laminated structure, and the first high melting point metal layer and the second high melting point metal layer are mutually alloyed by the transient liquid phase bonding, wherein
the low melting point metal thin film layer is formed with one of the group consisting of an Sn layer and an Sn—Ag eutectic solder layer, and
the high melting point metal thin film layers and the first high melting point metal layer are formed with an Ag layer, and the second high melting point metal layer is formed with an Ni layer.

7. The semiconductor device according to claim 6, wherein a semiconductor material whose bandgap energy is 1.1 eV to 8 eV is used for the semiconductor device.

8. The semiconductor device according to claim 6 further comprising:
a second conducting metal layer disposed on a back side surface of the insulating substrate of the opposite side to the surface of the insulating substrate where the first conducting metal layer is disposed;
a second laminated high melting point soldering layer disposed on a back side surface of the second conducting metal layer of the opposite side to the surface of the second conducting metal layer where the insulating substrate is disposed; and
a base plate disposed on a back side surface of the second laminated high melting point soldering layer of the opposite side to the surface of the second laminated high melting point soldering layer where the second conducting metal layer is disposed, wherein
the second laminated high melting point soldering layer is formed by the transient liquid phase bonding.

9. The semiconductor device according to claim 8, wherein the second laminated high melting point soldering layer includes: a laminated structure which laminated a plurality of three-layered structures, the respective three-layered structures including a low melting point metal thin film layer and high melting point metal thin film layers disposed on a surface and a back side surface of the low melting point metal thin film layer; a first high melting point metal layer disposed on a surface of the laminated structure; and a second high melting point metal layer disposed on a back side surface of the laminated structure,
the low melting point metal thin film layer and the respective high melting point metal thin film layers are mutually alloyed by the transient liquid phase bonding, and
the laminated structure, and the first high melting point metal layer and the second high melting point metal layer are mutually alloyed by the transient liquid phase bonding.

10. A semiconductor device comprising:
an insulating substrate;
a second conducting metal layer disposed on the insulating substrate;
a second laminated high melting point soldering layer disposed on the second conducting metal layer; and
a base plate disposed on the second laminated high melting point soldering layer, wherein
the second laminated high melting point soldering layer is formed by transient liquid phase bonding, wherein
the second laminated high melting point soldering layer includes: a laminated structure which laminated a plurality of three-layered structures, the respective three-layered structures including a low melting point metal thin film layer and high melting point metal thin film layers disposed on a surface and a back side surface of the low melting point metal thin film layer; a first high melting point metal layer disposed on a surface of the laminated structure; and a second high melting point metal layer disposed on a back side surface of the laminated structure,
the low melting point metal thin film layer and the respective high melting point metal thin film layers are mutually alloyed by the transient liquid phase bonding, and
the laminated structure, and the first high melting point metal layer and the second high melting point metal layer are mutually alloyed by the transient liquid phase bonding, wherein
the low melting point metal thin film layer is formed with one of the group consisting of an Sn layer and an Sn—Ag eutectic solder layer, and
the high melting point metal thin film layers and the first high melting point metal layer are formed with an Ag layer, and the second high melting point metal layer is formed with an Ni layer.

11. The semiconductor device according to claim 10 further comprising a barrier metal layer disposed on upward and downward of the insulating substrate.

12. The semiconductor device according to claim 11, wherein the barrier metal layer includes an Ni layer.

13. The laminated high melting point soldering layer according to claim 1, wherein die detachment strength of the laminated high melting point soldering layer is not less than 80N at a temperature of 300 degrees C.

14. The semiconductor device according to claim 6, wherein die detachment strength of the first laminated high melting point soldering layer is not less than 80N at a temperature of 300 degrees C.

15. The semiconductor device according to claim 10, wherein die detachment strength of the second laminated high melting point soldering layer is not less than 80N at a temperature of 300 degrees C.

* * * * *